(12) United States Patent
Amiya et al.

(10) Patent No.: US 10,276,408 B2
(45) Date of Patent: Apr. 30, 2019

(54) FLOW-RATE REGULATOR DEVICE, DILUTED CHEMICAL-LIQUID SUPPLY DEVICE, LIQUID PROCESSING APPARATUS AND ITS OPERATING SYSTEM

(71) Applicant: TOKYO ELECTRON LIMITED, Minato-ku (JP)

(72) Inventors: Michitaka Amiya, Koshi (JP); Takami Satoh, Koshi (JP); Kazuyoshi Eshima, Koshi (JP); Akihiro Nakamura, Koshi (JP); Koji Tanaka, Koshi (JP); Kazuki Kosai, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 538 days.

(21) Appl. No.: 14/850,139

(22) Filed: Sep. 10, 2015

(65) Prior Publication Data
US 2015/0380280 A1 Dec. 31, 2015

Related U.S. Application Data (63) Continuation of application No. PCT/JP2014/078808, filed on Oct. 29, 2014.

(30) Foreign Application Priority Data

Oct. 30, 2013 (JP) .................................. 2013-225841
Apr. 18, 2014 (JP) .................................. 2014-086671
Sep. 25, 2014 (JP) .................................. 2014-195361

(51) Int. Cl.
*H01L 21/67* (2006.01)
*B01D 19/02* (2006.01)
(Continued)

(52) U.S. Cl.
CPC ........ *H01L 21/67051* (2013.01); *B01D 19/02* (2013.01); *B01F 3/0865* (2013.01);
(Continued)

(58) Field of Classification Search
CPC . H01L 21/67051; B01D 19/02; B01F 3/0865; B01F 15/00357; B01F 15/026; B08B 3/08
(Continued)

(56) References Cited

U.S. PATENT DOCUMENTS 4,015,617 A * 4/1977 Connolly ............ A61M 16/104
137/605
4,391,390 A * 7/1983 Howard .................. B01F 15/04
137/205.5
(Continued)

FOREIGN PATENT DOCUMENTS

JP 2003-120606 A 4/2003
JP 2006-278655 A 10/2006
(Continued)

OTHER PUBLICATIONS

Matsumoto et al., "Liquid Treatment Apparatus" Sep. 2011, JP 2011-176118 Machine Translation.*
(Continued)

*Primary Examiner* — David G Cormier
*Assistant Examiner* — Thomas Bucci
(74) *Attorney, Agent, or Firm* — Oblon, McClelland, Maier & Neustadt, L.L.P.

(57) ABSTRACT

A flow-rate regulator device for controlling a flow rate of a liquid includes a first flow-rate regulator component positioned on an upstream side of a liquid line, and a second flow-rate regulator component positioned on a downstream side of the liquid line and connected in series to the first flow-rate regulator component. The first flow-rate regulator component adjusts a degree of opening such that a flow rate (Continued)

of liquid flowing through the liquid line is set a specified number of times greater than a target flow rate when the second flow-rate regulator component has a full opening, and the second flow-rate regulator component adjusts a degree of opening such that the flow rate of the liquid flowing through the liquid line is to be at the target flow rate when the first flow-rate regulator component is adjusted to have the degree of opening.

21 Claims, 5 Drawing Sheets

(51) Int. Cl.
    *B01F 3/08*     (2006.01)
    *B01F 15/00*     (2006.01)
    *B01F 15/02*     (2006.01)
    *B08B 3/08*     (2006.01)
    *G05D 7/01*     (2006.01)
    *G05D 11/13*     (2006.01)

(52) U.S. Cl.
    CPC ...... *B01F 15/00357* (2013.01); *B01F 15/026* (2013.01); *B08B 3/08* (2013.01); *G05D 7/01* (2013.01); *G05D 11/138* (2013.01); *B01F 2215/0077* (2013.01); *H01L 21/67017* (2013.01)

(58) Field of Classification Search
    USPC ..... 134/56 R, 18, 2, 21, 26, 1, 30, 33, 57 R, 134/58 R, 95.1; 137/487.5, 3, 2, 606, 88, 137/99, 486; 118/715, 726, 719
    See application file for complete search history.

(56) References Cited

U.S. PATENT DOCUMENTS

| | | | | |
|---|---|---|---|---|
| 6,073,653 | A * | 6/2000 | Nishio | G05D 7/0688 137/486 |
| 6,203,183 | B1 * | 3/2001 | Mordaunt | B01F 3/088 366/138 |
| 6,982,006 | B1 * | 1/2006 | Boyers | A61L 2/183 134/1 |
| 8,109,282 | B2 * | 2/2012 | Miya | H01L 21/67028 134/102.1 |
| 8,282,265 | B2 * | 10/2012 | Breithhaupt | B01F 3/08 366/152.2 |
| 2002/0104552 | A1 * | 8/2002 | Bay | H01L 21/67017 134/18 |
| 2003/0010450 | A1 * | 1/2003 | Yang | C23C 14/566 156/345.31 |
| 2004/0100860 | A1 * | 5/2004 | Wilmer | B01F 3/0092 366/136 |
| 2006/0219264 | A1 * | 10/2006 | Miya | H01L 21/67051 134/21 |
| 2006/0285429 | A1 * | 12/2006 | Kamimura | B01F 3/088 366/160.2 |
| 2007/0204912 | A1 * | 9/2007 | Hanada | G05D 11/132 137/487.5 |
| 2007/0204914 | A1 * | 9/2007 | Kurosawa | G05D 11/132 137/487.5 |
| 2007/0221271 | A1 * | 9/2007 | Sasaki | H01L 21/67023 137/7 |
| 2010/0320081 | A1 * | 12/2010 | Mayer | H01L 21/2885 204/242 |
| 2011/0061683 | A1 * | 3/2011 | Eshima | H01L 21/67017 134/18 |
| 2011/0141844 | A1 * | 6/2011 | Schell | B01F 5/0641 366/336 |
| 2012/0111374 | A1 * | 5/2012 | Despres | H01J 37/02 134/34 |
| 2012/0111412 | A1 * | 5/2012 | Satake | H01L 21/67017 137/1 |
| 2013/0014787 | A1 * | 1/2013 | Urata | H01L 21/6708 134/100.1 |
| 2013/0260569 | A1 * | 10/2013 | Ganster | H01L 21/67017 438/745 |

FOREIGN PATENT DOCUMENTS

| | | | |
|---|---|---|---|
| JP | 2008-251680 A | | 10/2008 |
| JP | 2010-232520 A | | 10/2010 |
| JP | 2010232520 A | * | 10/2010 |
| JP | 2011-125857 A | | 6/2011 |
| JP | 2011-151283 A | | 8/2011 |
| JP | 2011-176118 A | | 9/2011 |
| JP | 2011176118 A | * | 9/2011 |

OTHER PUBLICATIONS

Yoshida et al., "Processing Liquid Feeder" Oct. 2010, JP 2010-232520 Machine Translation.*

International Search Report dated Jan. 27, 2015 in PCT/JP2014/078808 filed Oct. 29, 2014.

* cited by examiner

FLOW-RATE REGULATOR DEVICE, DILUTED CHEMICAL-LIQUID SUPPLY DEVICE, LIQUID PROCESSING APPARATUS AND ITS OPERATING SYSTEM

CROSS-REFERENCE TO RELATED APPLICATIONS

The present application is a continuation of and claims the benefit of priority to International Application No. PCT/JP2014/078808, filed Oct. 29, 2014, which is based upon and claims the benefit of priority to Japanese Patent Applications No. 2013-225841, filed Oct. 30, 2013, No. 2014-086671, filed Apr. 18, 2014, and No. 2014-195361, filed Sep. 25, 2014. The entire contents of these applications are incorporated herein by reference.

BACKGROUND OF THE INVENTION

Field of the Invention

The present invention relates to a flow-rate regulator device for controlling the flow rate of a liquid, a diluted chemical-liquid supply device that uses the flow-rate regulator device, and a liquid processing apparatus and its operating system for processing a substrate using the diluted chemical liquid supplied by the diluted chemical-liquid supply device.

Description of Background Art

JP2011-151283A describes procedures for manufacturing a semiconductor device by cleaning etching residue with an organic chemical solution followed by rinsing with a rinsing solution prepared by dissolving a hydrogen gas (reducing gas) in an ammonia solution.

JP2008-251680A describes a liquid processing apparatus equipped with a device for preparing a chemical liquid at a suer-low concentration diluted hydrofluoric acid). The apparatus in JP2008-251680A has multiple chemical-liquid storage tanks and chemical liquid mixing devices: a first tank stores a chemical liquid diluted by a first mixing device at a relatively high concentration; a second tank stores a chemical liquid obtained by diluting the diluted chemical liquid stored in the first tank to a lower concentration by using a second mixing device; and the second mixing device dilutes the diluted chemical liquid stored in the second tank to a super-low concentration, and then supplies the liquid to a substrate through a nozzle. As described, by diluting a chemical liquid multiple times, an accurately controlled super-low diluted chemical liquid is supplied.

The entire contents of these publications are incorporated herein by reference.

SUMMARY OF THE INVENTION

According to one aspect of the present invention, a flow-rate regulator device for controlling a flow rate of a liquid includes a first flow-rate regulator component positioned on an upstream side of a liquid line, and a second flow-rate regulator component positioned on a downstream side of the liquid line and connected in series to the first flow-rate regulator component. The first flow-rate regulator component adjusts a degree of opening such that a flow rate of liquid flowing through the liquid line is set a specified number of times greater than a target flow rate when the second flow-rate regulator component has a full opening, and the second flow-rate regulator component adjusts a degree of opening such that the flow rate of the liquid flowing through the liquid line is to be at the target flow rate when the first flow-rate regulator component is adjusted to have the degree of opening.

According to another aspect of the present invention, a diluted chemical liquid-supply apparatus includes a chemical-liquid line which flows a chemical liquid supplied from a chemical-liquid supply source, a liquid-diluent line which flows a liquid diluent supplied from a liquid-diluent supply source, a mixing device which mixes the chemical liquid supplied from the chemical-liquid line and the liquid diluent supplied from the liquid-diluent supply line such that a diluted chemical liquid including the chemical liquid and the liquid diluent is prepared, and a flow-rate regulator device which is positioned on the chemical-liquid line such that the flow-rate regulator device is on an upstream side of the mixing device and controls a flow rate of the chemical liquid flowing through the chemical-liquid line. The flow-rate regulator device includes a first flow-rate regulator component positioned on an upstream side of the chemical-liquid line, and a second flow-rate regulator component positioned on a downstream side of the chemical-liquid line and connected in series to the first flow-rate regulator component, the first flow-rate regulator component adjusts a degree of opening such that a flow rate of the chemical liquid flowing through the chemical-liquid line is set a specified number of times greater than a target flow rate when the second flow-rate regulator component has a full opening, and the second flow-rate regulator component adjusts a degree of opening such that the flow rate of the chemical liquid flowing through the chemical-liquid line is to be at the target flow rate when the first flow-rate regulator component is adjusted to have the degree of opening.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements through the various drawings.

Figure 1:
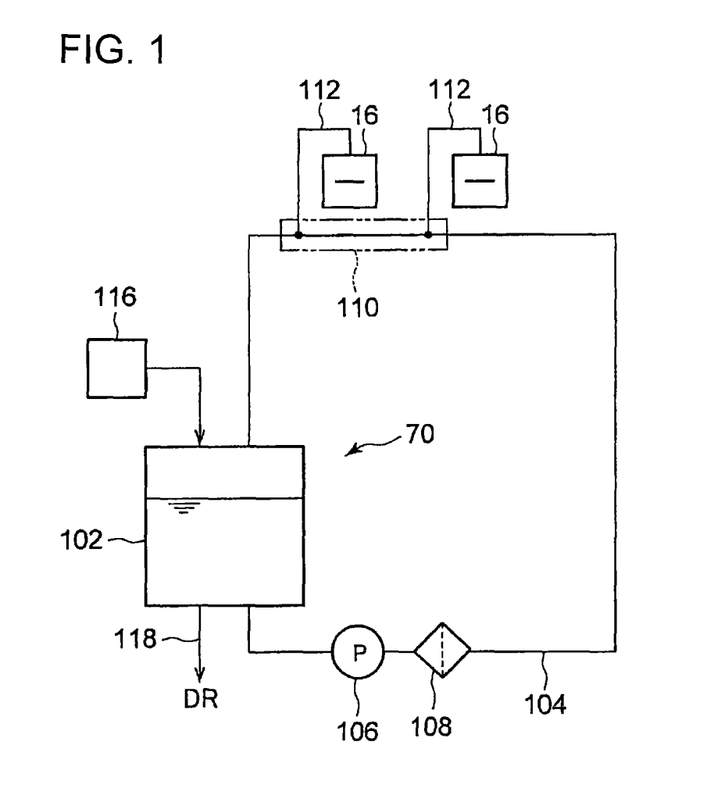
FIG. 1 is a pipeline diagram schematically showing the entire structure of a liquid processing apparatus.

As shown in FIG. 1, a liquid processing apparatus of an embodiment includes multiple processing units (liquid processing units) 16 to perform liquid treatment on a substrate, and processing liquid supply source 70 to supply a processing liquid to processing units 16.

Processing liquid supply source 70 includes tank 102 to store a processing liquid and circulation line 104 through which a liquid circulates starting at tank 102 and returning to tank 102. Pump 106 is installed in circulation line 104. Pump 106 forms a circulation flow that starts at tank 102, goes through circulation line 104 and returns to tank 102. Filter 108 is provided for circulation line 104 on the downstream side of pump 106 to remove contaminants such as particles contained in a processing liquid. If applicable, auxiliary devices (a heater, for example) may further be installed on circulation line 104.

One or multiple branch lines 112 are connected to connection region 110 positioned on circulation line 104. Each branch line 112 supplies processing unit 16 with a processing liquid flowing through circulation line 104. It is an option for each branch line 112 to have a flow-rate regulator such as a flow-rate control valve, a filter and the like.

The liquid processing apparatus has a tank liquid-refill device 116 to refill tank 102 with a processing liquid or components of a processing liquid. Drainpipe 118 is provided for tank 102 to drain the processing liquid from tank 102.

Figure 2:
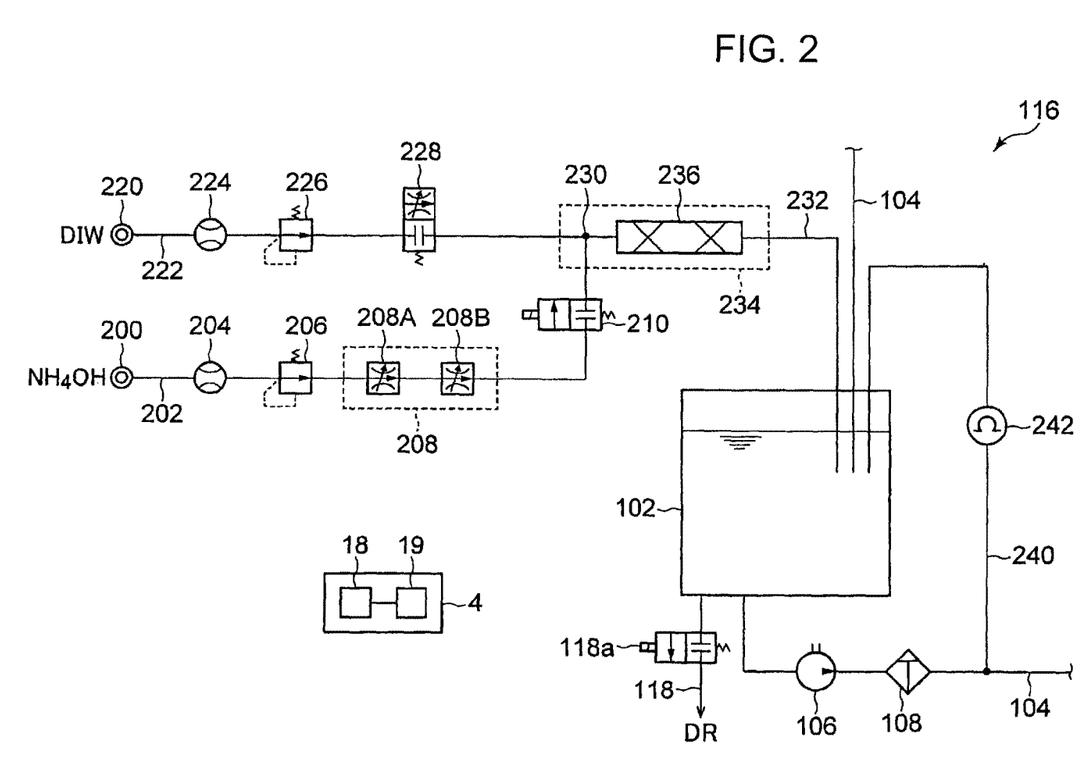
FIG. 2 is a pipeline diagram showing the detailed structure near a tank of the liquid processing apparatus.

As shown in FIG. 2, control device 4 is provided for the liquid processing apparatus. Control device 4 is a computer, for example, and includes control component 18 and memory component 19. Memory component 19 stores a program that controls various procedures carried out in the liquid processing apparatus. Control component 18 controls operations of the liquid processing apparatus by reading out and executing the program stored in memory component 19.

The program may be stored in a computer-readable memory medium and installed from the medium into memory component 19 of control device 4. Examples of a computer-readable memory medium are hard disks (HD), flexible disks (FD), compact discs (CD), magneto-optical discs (MO), memory cards and the like.

The structure near tank 102 of the liquid processing apparatus shown in FIG. 1 is further described in detail by referring to FIG. 2. Although not shown in FIG. 2, connection region 110 is formed on circulation line 104 the same as in FIG. 1. One or multiple branch lines 112 are connected to the connection region, and a liquid processing unit 16 is connected to each branch line 112.

An example of the processing liquid in the following description is a super-low concentration ammonia solution (specifically at an approximate concentration of 1 ppm-30 ppm) obtained by diluting a chemical solution, for example, 28-30 wt % $NH_4OH$, with pure water (DIW).

Tank liquid-refill device 116 (diluted chemical-liquid supply device) has chemical liquid line 202 to flow a chemical liquid that is supplied from chemical-liquid supply source 200, and liquid-diluent line 222 to flow a liquid diluent that is supplied from liquid-diluent supply source 220 and is used for diluting a chemical liquid.

Chemical-liquid line 202 is provided with flowmeter 204, constant-pressure valve 206, flow-rate regulator device (flow-rate control device) 208 and switching valve 210 in that order from the upstream side.

Constant-pressure valve 206 reduces pressure so as to maintain the pressure on the downstream side at a desired constant level. The chemical liquid supplied from chemical-liquid supply source 200 usually shows varied pressure levels. Thus, for flow-rate regulator device 208 to accurately control a flow rate, the upstream-side pressure of flow-rate regulator device 208 is stabilized. Accordingly, constant-pressure valve 206 is preferred to be installed.

Flow-rate regulator device 208 is provided with first flow-rate regulator component (208A) and second flow-rate regulator component (208B) installed in series in that order from the upstream side of chemical-liquid line 202. Second flow-rate regulator component (208B) is used to exercise precise control of the flow rate of a chemical liquid flowing through chemical-liquid line 202, whereas first flow-rate regulator component (208A) is used to mitigate such factors that cause variations in the flow rate before second flow-rate regulator component (208B) exercises precise control of the flow rate. First and second flow-rate regulator components (208A, 208B) are each preferred to be set as a needle valve capable of conducting precise control of flow rates. The same type may be used for both first and second flow-rate regulator components (208A, 208B).

Liquid-diluent line 222 is provided with flowmeter 224, constant-pressure valve 226 and switchable flow-rate control valve 228 in that order from the upstream side. Switchable flow-rate control valve 228 may be replaced with a combination of a switching valve and an independent flow-rate control valve. Since DIW flows through liquid-diluent line 222 at a relatively high volume, there is no specific difficulty observed for controlling its flow rate. Thus, devices (valves or the like) to be installed on liquid-diluent line 222 are optional as long as the flow rate of DIW is controlled at a specified value.

Chemical-liquid line 202 and liquid-diluent line 222 merge at merging point 230. It is preferred for liquid-diluent line 222 to be extended to become diluted chemical-liquid line 232. Mixing device 234 is provided near merging point 230. Mixing device 234 mixes a chemical liquid supplied from chemical-liquid line 202 and a liquid diluent supplied from liquid-diluent line 222.

In the embodiment shown in the drawings, mixing device 234 is structured to have a pipe-coupling structure (not shown) at merging point 230 of the pipe for chemical-liquid line 202 and the pipe for liquid-diluent line 222, and inline mixer 236 provided on a slightly downstream side of merging point 230. An inline mixer is a device to facilitate stirring of liquids in the pipe. Since variations in the concentrations of the chemical liquid in a diluted chemical liquid are to be prevented to the extent possible, an inline mixer is preferred to be used.

However, mixing device 234 is not limited to the structure shown in the drawings, as long as a chemical liquid and a liquid diluent are fully mixed.

Measuring line 240 is branched from circulation line 104. Measuring line 240 brings in part of the diluted chemical liquid flowing through circulation line 104 and releases it toward tank 102. Measuring line 240 is provided with conductivity meter 242, which measures the conductivity (resistivity) of a diluted chemical liquid flowing through circulation line 104. A super-low concentration of a diluted chemical liquid is accurately calculated based on the measured conductivity. The position to install conductivity meter 242 is not limited to the one shown in FIG. 2, and may be installed in any circulation system that includes tank 102 and circulation line 104 and in any flow channel connected to such a circulation system.

The following describes a method for operating the liquid processing apparatus.

First, a diluted chemical liquid at a specified concentration is supplied from tank liquid-refill device 116 to tank 102. The desired concentration here is set at 1 ppm, for example. When the chemical liquid is a 29% ammonia solution, to obtain a concentration of 1 ppm, the mixing ratio of an ammonia solution to DIW is approximately 1:261,000.

When DIW is flowed into liquid-diluent line 222 at a flow rate of 30 L/min, the flow rate of a 29% ammonia solution to be flowed into chemical-liquid line 202 is approximately 0.115 mL/min.

The respective degrees of opening of first and second flow-rate regulator components (208A, 208B) (hereinafter also referred to as first and second needle valves (208A, 208B)) to achieve a target flow rate are calculated in advance through testing (preliminary operations). For actual operations (operations for processing substrates), first and second needle valves (208A, 208B) are set at those openings obtained in advance.

The degrees of opening of needle valves (208A, 208B) are usually adjusted by rotating (automatically or manually) the adjustment knob so that the needle is vertically moved by the screw mechanism connected to the adjustment knob. The degree of rotation of the adjustment knob (the point at a certain angle) is adjusted to match the rotation degree determined during preliminary operations so that the target flow rate is achieved efficiently.

From chemical-liquid line 202 and liquid-diluent line 222, a chemical liquid and a liquid diluent are respectively supplied at the above specified flow rate, mixed in inline mixer 236 and fed into tank 102. When a specified amount of the diluted chemical liquid is supplied into tank 102, pump 106 is driven so that the diluted chemical liquid circulates through a circulation system that includes tank 102 and circulation line 104 (also includes measuring line 240) to conduct prewash through the circulation system. Then, switching valve (118a) of drain device 118 (see FIG. 2) is opened to drain the diluted chemical liquid in the circulation system.

Next, switching valve (118a) is closed, and the diluted chemical liquid is fed again from tank liquid-refill device 116 into tank 102, while pump 106 is driven to circulate the diluted chemical liquid in the circulation system that includes tank 102 and circulation line 104. Then, using conductivity meter 242 installed on measuring line 240, the concentration of the diluted chemical liquid in the circulation system is checked to see whether it falls within an acceptable range.

When the concentration of the diluted chemical liquid is verified to be within the acceptable range, a processing liquid is flowed to a processing unit 16 through the diluted chemical-liquid supply line, that is, circulation line 104 and branch line 112. Each processing unit 16 is provided with a nozzle (not shown) connected to the end of branch line 112. Using specified timing, the diluted chemical liquid is supplied from the nozzle to a substrate so that a predetermined liquid process (such as rinsing) is performed on the substrate using the diluted chemical liquid.

The above nozzle (not shown) may also be a two-fluid nozzle for spraying two fluids by mixing a super-low concentration ammonia solution and a hydrogen gas.

When the concentration of a diluted chemical liquid is found to be outside the acceptable range, switching valve (118a) of drain device 118 (see FIG. 2) is opened to completely drain the diluted chemical liquid in the circulation system that includes tank 102 and circulation line 104 (also includes measuring line 240). Then, based on the result obtained when the concentration of the diluted chemical liquid was checked, the degree of opening of second needle valve (208B) is fine-adjusted. After such tuning, another diluted chemical liquid is prepared, fed into the tank and circulated through the lines, and its concentration is checked again. When the concentration of the diluted chemical solution is confirmed to be within the acceptable range, the aforementioned process starts on a substrate.

According to the present embodiment, since first and second needle valves (208A, 208B) are positioned in series on chemical-liquid line 202, even a super-low flow rate of a chemical liquid is accurately controlled and supplied from chemical-liquid line 202 to merging point 230.

According to test operations, a flow rate approximately the same as the target flow rate (super-low flow rate) was achieved using only first needle valve (208A), but the flow rate control accuracy was not exactly a satisfactory level. By contrast, the flow rate control was satisfactorily accurate when first and second needle valves (208A, 208B) were installed in series.

According to test operations, it is found that the flow rate of a chemical liquid flowing through chemical-liquid line 202 can be controlled highly accurately when the degrees of opening of first and second needle valves (208A, 208B) are determined by the following method.

(1) First, while second needle valve (208B) is fully opened, the degree of opening of first needle valve (208A) is adjusted so that the actual flow rate of a chemical liquid flowing through chemical-liquid line 202 is a certain number of times greater than the target flow rate (10 times, for example). For example, if the target flow rate is 0.1 mL/min, the actual flow rate is set at 1 mL/min; if the target flow rate is 0.3 mL/min, the actual flow rate is set at 3 mL/min.

(2) Next, while the degree of opening of first needle valve (208A) is maintained, the degree of opening of second needle valve (208B) is adjusted so as to achieve the target flow rate for the chemical liquid flowing through chemical-liquid line 202.

As described above, when degrees of opening for first and second needle valves (208A, 208B) are both adjusted based on the target flow rate, it is found that the flow rate of the chemical liquid flowing through chemical-liquid line 202 is adjusted with high accuracy. The relationship between a target flow rate and degrees of opening of first and second needle valves (208A, 208B) that are most preferred for such a target flow rate is obtained in advance through test operations for various target flow rates. Then, for actual operations, the degrees of opening of first and second needle valves (208A, 208B) are adjusted based on the obtained relationship. Accordingly, it is found that various flow rates are achieved accurately.

Following are thought to be the reasons for the advantage achieved when first and second needle valves (208A, 208B) are provided in series. Even if a needle valve can control a flow rate relatively accurately within a certain range, to achieve an accurate flow rate, the acceptable range for a change in the upstream-side pressure is thought to be relatively narrow. If the upstream-side pressure of the downstream-side needle valve is controlled within a preferable range by adjusting the degree of opening of the upstream-side needle valve, the flow rate of a liquid passing through the downstream-side needle valve is controlled more accurately. Thus, providing first and second needle valves (208A, 208B) in series makes it possible to perform a super-low flow rate that is unlikely to be achieved by using one needle valve.

In the above embodiment, first and second flow-rate regulator components (208A, 208B) are each set as a needle valve. However, that is not the only option. Other flow-rate regulator components such as a diaphragm valve may also be used.

In the above embodiment, the flow rate of a chemical liquid flowing through chemical-liquid line 202 is super low, for example, from 0.1 mL/min to an amount a few times as great. The above embodiment is especially suitable for controlling super-low flow rates. However, controlling a flow rate through the combined functions of first and second flow-rate regulator components (208A, 208B) by positioning them in series on a chemical-liquid line is not limited to controlling super-low flow rates. Such a setting is also thought to be useful for achieving a level of control accuracy that is better than the control accuracy of each flow-rate regulator component when used independently.

In the above embodiment, the diluted chemical liquid was alkaline, that is, an ammonia solution with a super-low concentration. However, that is not the only option. A diluted chemical liquid may be acidic, for example, diluted hydrogen fluoride (DHF) or citric acid with a super-low concentration.

In the above embodiment, flow-rate regulator device (flow-rate control device) 208 is composed of two flow-rate regulator components, that is, needle valves (208A, 208B) positioned in series on chemical-liquid line 202 (liquid line). However, that is not the only option, and the flow-rate regulator device may be structured to have more than two, for example, three flow-rate regulator components positioned in series on chemical-liquid line 202.

In the above embodiment, first and second flow-rate regulator components (208A, 208B) are both adjustable (have adjustable openings). However, that is not the only option. For example, when the range for variations in flow rates to be controlled by flow-rate regulator device 208 is significantly small, first flow-rate regulator (208A) may be set as a fixed orifice.

In the above embodiment, flow-rate regulator device 208 controlled the flow rate of a chemical liquid. However, that is not the only option, and flow-rate regulator device 208 may be used for controlling the flow rate of any liquid.

In the above embodiment, after the flow rate of a liquid (chemical liquid) was controlled by flow-rate regulator device 208, the liquid was mixed with a liquid diluent and then supplied to a specified destination. However, a liquid with a flow rate controlled by flow-rate regulator device 208 may be supplied directly to the specified destination.

In the above embodiment, the diluted chemical-liquid supply device, which is equipped with chemical-liquid line 202, liquid-diluent line 222, mixing device 234 and flow-rate regulator device 208, corresponds to tank liquid-refill device 116 for supplying a diluted chemical liquid to tank 102. However, that is not the only option. Such a diluted chemical-liquid supply device may be structured to directly supply a processing liquid to processing unit 16 without going through tank 102.

Figure 3:
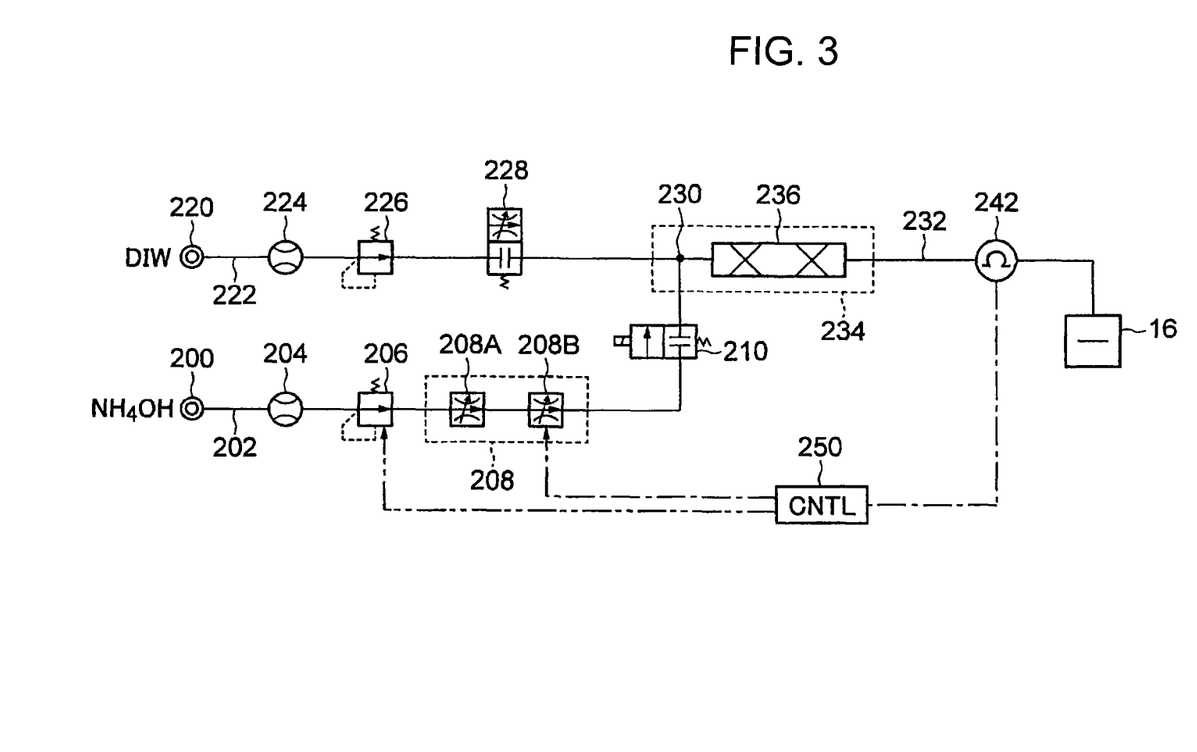
FIG. 3 is a pipeline diagram in a modified example where a diluted chemical liquid is directly supplied from a diluted chemical-liquid supply device to a liquid processing unit.

In such a structure, the liquid processing apparatus is structured as shown in FIG. 3. Members in FIG. 3 identical to those shown in FIGS. 1 and 2 are assigned the same reference numerals. In the embodiment shown in FIG. 3, diluted chemical-liquid line 232 is directly connected to liquid processing unit 16. Conductivity meter 242 is installed on diluted chemical-liquid line 232. By feeding back the actual concentration value of a diluted chemical solution obtained from the value detected by conductivity meter 242, controller 250 adjusts the degree of opening of needle valve (208B) (control example 1) or adjusts the setting of the downstream-side pressure of constant-pressure valve 206 (control example 2) so that the actual concentration value of the diluted chemical liquid shows no deviation from the target value (such as provided by control device 4).

When control example 1 is employed, needle valve (208B) is structured so as to automatically adjust the degree of opening. When control example 2 is employed, constant-pressure valve 206 is structured so as to adjust the setting for the downstream-side pressure, for example, by changing the pressure of pressurized air brought into a pilot port (pilot pressure). The pilot pressure can be controlled by using an electropneumatic regulator, for example.

Figure 4:
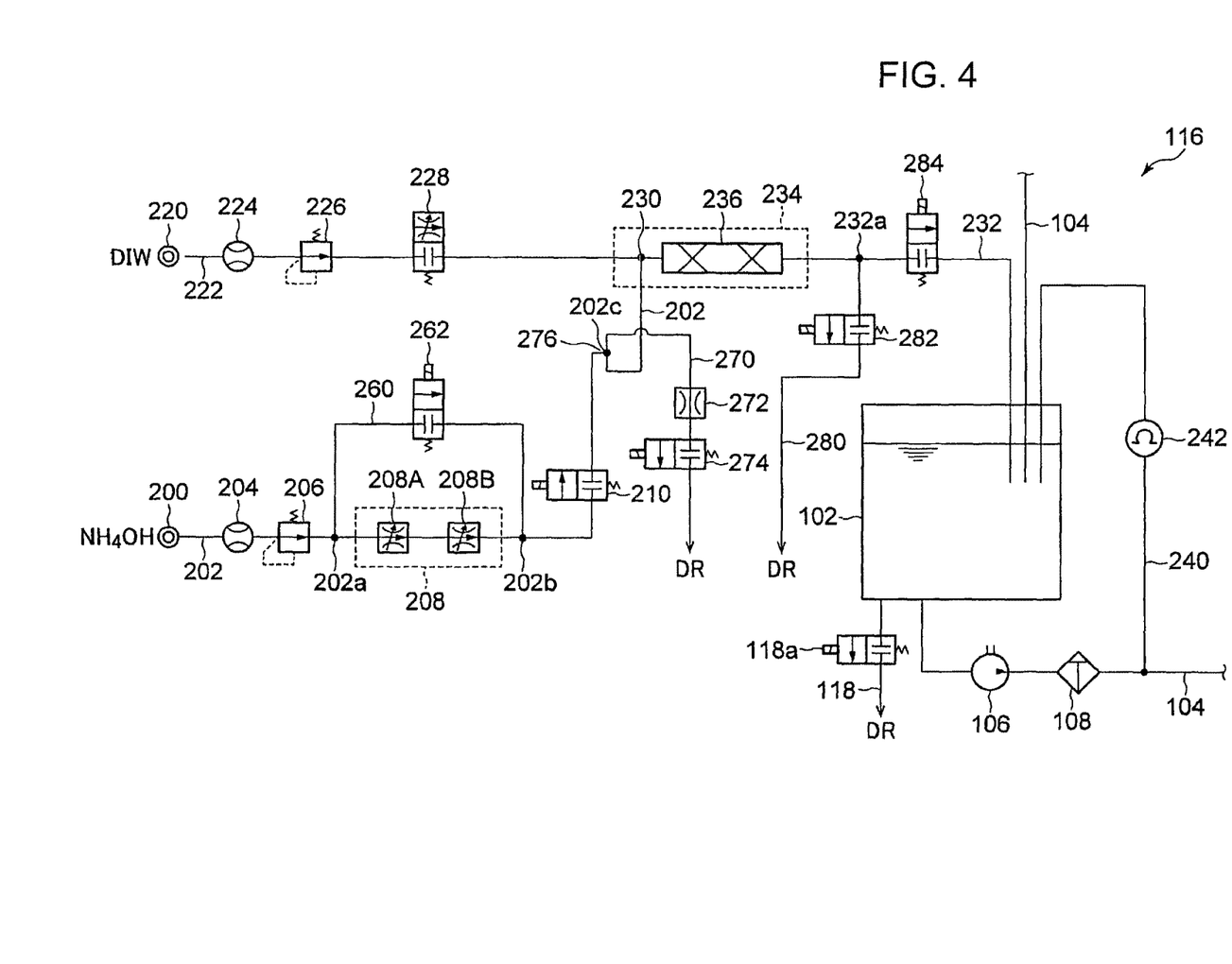
FIG. 4 is a pipeline diagram showing a part of the structure, the same part as that in FIG. 2, according to another embodiment of the liquid processing apparatus.

Yet another embodiment of tank liquid-refill device 116 in the liquid processing apparatus is described by referring to FIG. 4-7. FIG. 4 is a diagram of a liquid processing apparatus showing the same part of the pipeline as that shown in FIG. 2. The same reference numerals are assigned in FIG. 4 to members identical to those in FIG. 2, and their redundant descriptions are omitted here.

As shown in FIG. 4, bypass line 260 is provided, which branches off from chemical-liquid line 202 at branching point (202a) on the upstream side of flow-rate regulator device 208 and merges with chemical-liquid line 202 at merging point (202b) on the downstream side of flow-rate regulator device 208. Bypass line 260 is provided with switching valve 262. The pipe diameter of bypass line 260 is set so that, when switching valve 262 is opened, the flow rate of a chemical liquid flowing through bypass line 260 is greater, preferably significantly greater, than the flow rate of a chemical liquid flowing through part of chemical-liquid line 202 between branching point (202a) and merging point (202b).

At branching point (202c) between switching valve 210 and merging point 230, second drain line 270 for removing bubbles branches off from chemical-liquid line 202. Orifice 272 and switching valve 274 are provided in that order from the upstream side of second drain line 270.

Figure 5:
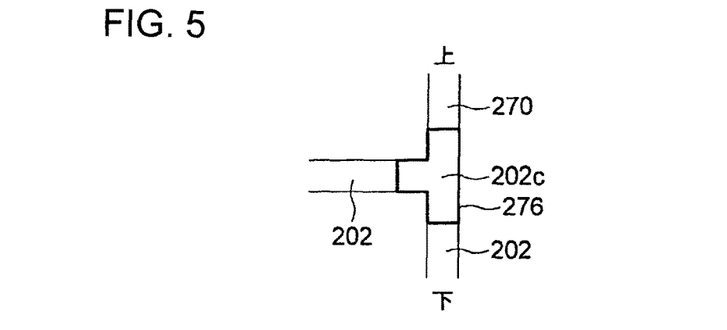
FIG. 5 is a schematic view of a bubble separator device provided in the chemical-liquid line in FIG. 4.

FIG. 5 schematically shows the structure near branching point (202c). T-shaped pipe connector 276 is provided at branching point (202c). The pipe for chemical-liquid line 202 on the upstream side of branching point (202c) extends horizontally toward branching point (202c) and is connected to the horizontal joint of T-shaped pipe connector 276. The pipe for chemical-liquid line 202 on the downstream side of branching point (202c) extends vertically upward heading toward branching point (202c) and is connected to the face-down joint of T-shaped pipe connector 276. The pipe for second drain line 270 extends vertically downward heading toward branching point (202c) and is connected to the face-up joint of T-shaped pipe connector 276. T-shaped pipe connector 276 structured as above works as a bubble separator device.

At branching point (232a) on the downstream side of mixing device 234, first drain line 280 for preliminary drainage branches off from diluted chemical-liquid line 232. Switching valve 282 is provided on first drain line 280. On the downstream side of branching point (232a), switching valve 284 is provided on diluted chemical-liquid line 232. Switching valves (282, 284) are switched on and off appropriately so as to switch a stage for supplying a diluted chemical liquid to tank 102 from diluted chemical-liquid line 232 and a stage for draining the liquid through first drain line 280 without filling tank 102. Instead of using switching valves (282, 284), a three-way valve, for example, may be provided at branching point (232a) as a switching mechanism for switching the above two stages.

Figure 6:
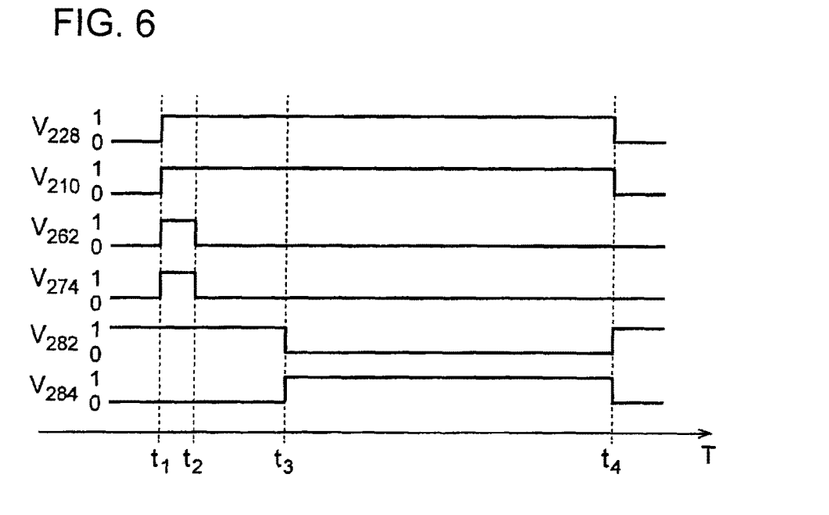
FIG. 6 is a time chart illustrating operations carried out by the liquid processing apparatus shown in FIG. 4.

Operations in tank liquid-refill device 116 shown in FIG. 4 are described by referring to the time chart in FIG. 6. In the time chart of FIG. 6, the horizontal axis indicates time, and V228, V210, V262, V274, V282 and V284 are referred to as switching valves (228, 210, 262, 274, 282 and 284)

respectively. In addition, "0" indicates the closed state of each valve, and "1" indicates the open state of each valve.

Prior to time (t1), tank liquid-refill device 116 is in standby mode. At time (t1), switching valves (228, 210, 262, 274, 282) are open while switching valve 284 is closed. Accordingly, a liquid diluent (DIW, here) starts flowing through liquid-diluent line 222 and a chemical liquid (ammonia solution, here) starts flowing through chemical-liquid line 202. The liquid diluent and chemical liquid are mixed at mixing device 234 to be a diluted chemical liquid. The diluted chemical liquid is not supplied to tank 102 between time (t1) and time (t3) but is drained from first drain line 280. Reasons for such operations are as follows.

Figure 7:
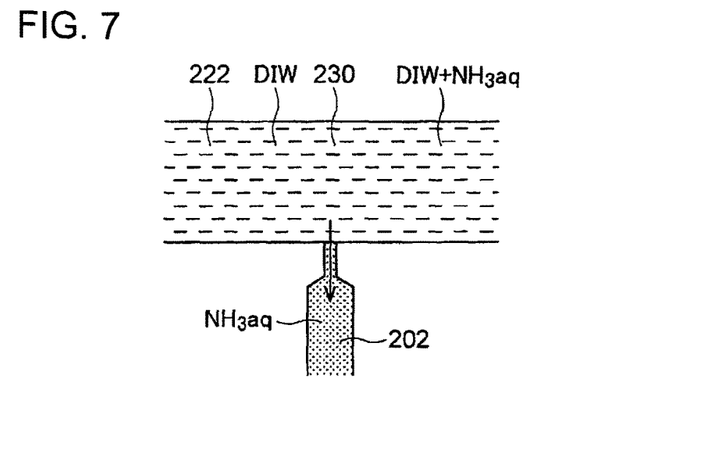
FIG. 7 is a view schematically showing why the concentration of a chemical liquid is not constant at an early stage of the liquid supply.

FIG. 7 schematically shows the structure of merging point 230 of chemical-liquid line 202 and liquid-diluent line 222. After tank liquid-refill device 116 is finished supplying a diluted chemical liquid and is transitioned to standby mode, the area near merging point 230 of liquid-diluent line 222 is filled with a liquid diluent or diluted chemical liquid. If left as is, the liquid diluent in liquid-diluent line 222, or the diluted chemical liquid, and the chemical liquid in chemical-liquid line 202 are dispersed with each other, resulting in a lower concentration of the chemical liquid in chemical-liquid line 202. In addition, at the moment switching valve 210 of chemical-liquid line 202 is transitioned from standby mode and is opened, the valve movement in switching valve 210 causes the pressure in chemical-liquid line 202 to be lowered. Accordingly, the liquid diluent or diluted chemical liquid is drawn into chemical-liquid line 202 (see the arrow in FIG. 7). Thus, the concentration of the chemical liquid flowing from chemical-liquid line 202 into merging point 230 is reduced for a while after the moment switching valve 210 is opened.

When the pressure exerted on the processing liquid in chemical-liquid line 202 is reduced by the valve movement in switching valve 210, dissolved gases in the liquid appear as bubbles. Such a phenomenon is seen to a certain degree in any liquid containing dissolved gas. Especially, an ammonia solution used as a chemical liquid in the present embodiment is prepared by dissolving in water an ammonia gas, which is easily liquefied with water and has a high vaporization pressure at room temperature. When the pressure of an ammonia solution is lowered, many ammonia gas bubbles appear in the ammonia solution. Since bubbles in an ammonia solution decrease the flow-rate control accuracy of the ammonia solution, the ammonia solution with bubbles is preferred to be removed promptly from chemical-liquid line 202.

Moreover, it takes a while for the flow rates of a chemical liquid and a liquid diluent to stabilize after the liquids begin flowing.

For the reasons above, it is difficult to set a diluted chemical liquid to have an accurate concentration directly after time (t1). Accordingly, until the concentration of the diluted chemical liquid formed at mixing device 234 stabilizes (until time (t3) in the example), a preliminary drain operation is conducted to drain the diluted chemical liquid from first drain line 280.

In the early stages of time (t1) to time (t3) during the preliminary drain operation, that is, between time (t1) and time (t2), a relatively large amount of an ammonia solution flows through bypass line 260. Also, part of the chemical liquid flowing through chemical-liquid line 202 is drained from second drain line 270.

By so doing, the chemical liquid with bubbles is promptly removed from chemical-liquid line 202. If there is no bypass line 260, since the flow rate of a chemical liquid flowing in chemical-liquid line 202 is controlled at a super-low rate by flow-rate regulator device 208 as described above, it takes a long time to remove the chemical liquid with bubbles from chemical-liquid line 202.

As structured and shown in FIG. 5, a chemical liquid that has flowed into T-shaped pipe connector 276 provided at branching point (202c) is diverted vertically; bubbles and part of the chemical liquid flow upward into first drain line 280, whereas the remaining chemical liquid containing no bubbles or hardly any bubbles flows downward into chemical-liquid line 202 on the downstream side of branching point (202c). Namely, T-shaped pipe connector 276 works as a bubble separator device. Orifice 272 prevents the chemical liquid from flowing into second drain line 270 in excess of that required for removing bubbles.

When the chemical liquid with bubbles is removed from chemical-liquid line 202, switching valves (262, 274) are closed (t2). The duration from (t1) to (t2) is obtained in advance by conducting testing or preliminary operations of the apparatus; it is 10 seconds or shorter, for example. After time (t2), a chemical liquid containing no bubbles or hardly any bubbles is flowed from chemical-liquid line 202 into mixing device 234, but the aforementioned preliminary drain operation is conducted until the flow-rate control is stabilized (namely, until (t3)).

At time (t3), switching valve 282 is closed while switching valve 284 is opened to turn off the preliminary drain operation and to start supplying a diluted chemical liquid to tank 102. The duration from (t1) to (t3) is also obtained in advance by conducting testing or preliminary operations of the apparatus; it is 60 seconds or shorter, for example.

When a desired amount of a diluted chemical liquid is supplied to tank 102 (time (t4) in FIG. 6), switching valves (228, 210, 284) are closed while switching valve 282 is opened to stop the supply of the diluted chemical liquid to tank 102. Tank liquid-refill device 116 is set in standby mode again.

According to the embodiment shown in FIG. 4, the aforementioned preliminary drain operation enables a diluted chemical liquid to be supplied at a more accurate concentration. In addition, the aforementioned air-venting operation enables a diluted chemical liquid to be supplied at an even more accurate concentration.

The structure for conducting a preliminary drain operation and an air-venting operation shown in FIG. 4-7 is also applicable to a liquid processing apparatus where a diluted chemical liquid is directly supplied to processing unit 16 (without diverting through tank 102 and circulation line 104) as shown in FIG. 3.

Inline mixer 236 provided in mixing device 234 in the above embodiment may be set as a combination of a (regular) static mixer and a time-lapsing mixer. It is preferred to set a static mixer on the upstream side and a time-lapsing mixer on the downstream side. Here, a "time-lapsing mixer" means a type structured to divert a liquid that has flowed into the mixer into multiple channels with different lengths and then to merge the diverted flows into one. A "(regular) static mixer" means a type without the above "time-lapsing" structure; it is structured to divert, convert, and reverse the flow in the mixer. A static mixer is more likely to achieve a uniform concentration in a cross-sectional direction of a pipe, whereas a time-lapsing mixer is more likely to achieve a uniform concentration in an axial direction of the pipe. By combining those mixers, a diluted chemical liquid is formed in a pipe to have a uniform concentration in both cross-sectional and axial directions.

Substrates processed in processing unit 16 may be any type used in the technological field for manufacturing semiconductor devices, for example, semiconductor wafers, glass substrates for LCDs, ceramic substrates and the like.

In a manufacturing step of a semiconductor device, when a via is formed by dry etching using a resist mask, etching residue derived from the resist remains in the via. The etching residue is removed by cleaning using an organic chemical liquid, and is rinsed thereafter. For the rinsing process, a rinsing solution is prepared by dissolving a hydrogen gas (reducing gas) in an ammonia solution and is used to prevent corrosion of copper wiring exposed on the via bottom.

The ammonia in a rinsing solution is to provide the minimum conductivity to the rinsing solution so as to prevent the device from damage caused by static charge. The amount of ammonia in a rinsing solution is set so as to avoid adversely affecting the device. Therefore, the concentration of an ammonia solution is controlled to a super-low level such as approximately 1 ppm.

When the numbers of chemical liquid storage tanks and chemical liquid mixing devices increase, the liquid processing apparatus increases in size.

According to an embodiment of the present invention, a flow-rate regulator device capable of accurately controlling super-low flow rates supplies a diluted chemical liquid at an accurately controlled super-low concentration without performing a multistep dilution procedure; a diluted chemical-liquid supply device is equipped with the flow-rate regulator device and is capable of preparing a diluted chemical liquid at an accurately controlled super-low concentration; and a liquid processing apparatus is equipped with the diluted chemical-liquid supply device.

An embodiment of the present invention is a flow-rate regulator device for controlling the flow rate of a liquid flowing through a liquid line; the device is equipped with a first flow-rate regulator component and a second flow-rate regulator component positioned on the liquid line in series in that order from the upstream side. The first flow-rate regulator component is adjusted to have a specified degree of opening so that the flow rate of a liquid flowing through the liquid line is set a certain number of times greater than a target flow rate when the second flow-rate regulator component is fully opened; and the second flow-rate regulator component is adjusted to have such a degree of opening that sets the flow rate of the liquid flowing through the liquid line to be at the target flow rate when the first flow-rate regulator component is set to have the specified degree of opening.

Another embodiment of the present invention is a diluted chemical-liquid supply device provided with the following: a chemical-liquid line to flow a chemical liquid supplied from a chemical-liquid supply source; a liquid-diluent line to flow a liquid diluent that is supplied from a liquid-diluent supply source and is used for diluting the chemical liquid; a mixing device to mix the chemical liquid supplied from the chemical-liquid line and the liquid diluent supplied from the liquid-diluent supply line so as to prepare a diluted chemical liquid; and a flow-rate regulator device provided on the chemical-liquid line to be positioned on the upstream side of the mixing device so as to control the flow rate of the chemical liquid flowing through the chemical-liquid line. The flow-rate regulator device is equipped with a first flow-rate regulator component and a second flow-rate regulator component positioned on the chemical-liquid line in series in that order from the upstream side. The first flow-rate regulator component is adjusted to have a specified degree of opening so that the flow rate of a chemical liquid flowing through the chemical-liquid line is set a certain number of times greater than a target flow rate when the second flow-rate regulator component is fully opened; and the second flow-rate regulator component is adjusted to have such a degree of opening that sets the flow rate of the chemical liquid flowing through the chemical-liquid line to be at the target flow rate when the first flow-rate regulator component is set to have the specified degree of opening.

Yet another embodiment of the present invention is a liquid processing apparatus equipped with the above diluted chemical-liquid supply device, and a processing unit to perform liquid processing on a substrate by using the diluted chemical liquid prepared by the diluted chemical-liquid supply device.

Yet another embodiment of the present invention provides a method for operating the above liquid processing apparatus. Such an operating method includes the following: adjusting the first flow-rate regulator component to have a specified degree of opening so that the flow rate of a chemical liquid flowing through the chemical-liquid line is set a certain number of times greater than a target flow rate when the second flow-rate regulator component is fully opened, while adjusting the second flow-rate regulator component to have such a degree of opening that sets the flow rate of the chemical liquid flowing through the chemical-liquid line to be at the target flow rate when the first flow-rate regulator component is set to have the specified degree of opening; by maintaining the above settings of the flow-rate regulator device, preparing a diluted chemical liquid by sending the chemical liquid through the chemical-liquid line and the liquid diluent through the liquid-diluent line into the mixing device; measuring the concentration of the diluted chemical liquid; and when the concentration of the diluted chemical liquid is within an acceptable range, starting treatment on a substrate in the processing unit by using the diluted chemical liquid, whereas when the concentration of the diluted chemical liquid is out of the acceptable range, adjusting the concentration of the diluted chemical liquid to be within the acceptable range by fine-adjusting the degree of opening of the second flow-rate regulator component.

According to an embodiment of the present invention, by setting first and second flow-rate regulator components to be positioned in series on a liquid line, the flow rate of a liquid flowing through the liquid line is controlled accurately even for a super-low concentration. In addition, when a liquid line is for a chemical liquid, the flow rate of a chemical liquid is accurately controlled. Accordingly, a low-concentration diluted chemical liquid is obtained at an accurately controlled concentration.

Obviously, numerous modifications and variations of the present invention are possible in light of the above teachings. It is therefore to be understood that within the scope of the appended claims, the invention may be practiced otherwise than as specifically described herein.

What is claimed is:

1. A diluted chemical liquid-supply apparatus, comprising:
   a chemical-liquid line which flows a chemical liquid supplied from a chemical-liquid supply source;
   a liquid-diluent line which flows a liquid diluent supplied from a liquid-diluent supply source;
   a mixing device configured to mix the chemical liquid supplied from the chemical-liquid line and the liquid diluent supplied from the liquid-diluent supply line such that a diluted chemical liquid comprising the chemical liquid and the liquid diluent is prepared;

a diluted chemical-liquid line which flows the diluted chemical liquid prepared by the mixing device;
a flow-rate regulator device positioned on the chemical-liquid line such that the flow-rate regulator device is on an upstream side of the mixing device and configured to control a flow rate of the chemical liquid flowing through the chemical-liquid line,
a first drain line which is branching from the diluted chemical-liquid line and drains the diluted chemical liquid flowing through the diluted chemical-liquid line;
a first switching device positioned on a downstream side of the mixing device such that the first switching device is configured to switch a flow of the diluted chemical liquid such that the diluted chemical liquid is drained from the diluted chemical-liquid line through the first drain line;
a bypass line which is branching from the chemical-liquid line on an upstream side of the flow-rate regulator device and merging to the chemical-liquid line on a downstream side of the flow-rate regulator device;
a second switching device positioned on the bypass line such that the second switching device is configured to control a flow rate of the chemical liquid flowing through the bypass line; and
a switching valve positioned on the chemical-liquid line such that the switching valve is on an upstream side of the mixing device and a downstream side of a merging point where the bypass line is merging to the chemical-liquid line and lowers pressure of the chemical liquid flowing in the chemical-liquid line to draw the liquid diluent or the diluted chemical liquid into the chemical-liquid line,
wherein the flow-rate regulator device comprises a first flow-rate regulator component positioned on an upstream side of the chemical-liquid line, and a second flow-rate regulator component positioned on a downstream side of the chemical-liquid line and connected in series to the first flow-rate regulator component, the first flow-rate regulator component is configured to adjust a degree of opening such that after the second flow-rate regulator component is set to a full opening, the first flow-rate regulator component sets a flow rate of the chemical liquid at the first flow-rate regulator component to a specified number of times greater than a target flow rate, and the second flow rate regulator component is configured to adjust a degree of opening such that after the first flow-rate regulator component is set to the flow rate, the second flow-rate regulator component sets the target flow rate of the chemical liquid at the second flow-rate regulator component.

2. A diluted chemical liquid-supply apparatus according to claim 1, further comprising:
a concentration measuring device configured to measure a concentration of the diluted chemical liquid,
wherein the second flow-rate regulator component of the flow-rate regulator device is configured to fine-adjust the degree of opening based on the concentration measured by the concentration measuring device.

3. A diluted chemical liquid-supply apparatus according to claim 1, wherein the first flow-rate regulator component comprises a needle valve, and the second flow-rate regulator component comprises a needle valve.

4. A diluted chemical liquid-supply apparatus according to claim 1, further comprising:
a bubble separating device configured to separate the chemical liquid containing bubble from the chemical liquid flowing through the chemical-liquid line and positioned on the chemical-liquid line such that the bubble separating device is on a downstream side of the switching valve and the upstream side of the mixing device; and
a second drain line which drains the chemical liquid containing bubble separated by the bubble separating device.

5. A diluted chemical liquid-supply apparatus according to claim 1, wherein the mixing device comprises a static mixer positioned on an upstream side and a time-lapsing mixer on a downstream side.

6. A diluted chemical liquid-supply apparatus according to claim 1, further comprising:
a constant-pressure valve positioned on the chemical-liquid line such that the constant-pressure valve is on an upstream side of the flow-rate regulator device.

7. A diluted chemical liquid-supply apparatus according to claim 1, further comprising:
a tank configured to store the diluted chemical liquid prepared by the mixing device.

8. A diluted chemical liquid-supply apparatus according to claim 2, wherein the first flow-rate regulator component comprises a needle valve, and the second flow-rate regulator component comprises a needle valve.

9. A diluted chemical liquid-supply apparatus according to claim 5, wherein the first flow-rate regulator component comprises a needle valve, and the second flow-rate regulator component comprises a needle valve.

10. A liquid processing apparatus, comprising:
a processing device configured to apply liquid processing to a substrate; and
a diluted chemical liquid-supply apparatus configured to supply a diluted chemical liquid to the processing device,
wherein the diluted chemical liquid-supply apparatus comprises a chemical-liquid line which flows a chemical liquid supplied from a chemical-liquid supply source, a liquid-diluent line which flows a liquid diluent supplied from a liquid-diluent supply source, a mixing device configured to mix the chemical liquid supplied from the chemical-liquid line and the liquid diluent supplied from the liquid-diluent supply line such that the diluted chemical liquid comprising the chemical liquid and the liquid diluent is prepared, a diluted chemical-liquid line which flows the diluted chemical liquid prepared by the mixing device, a flow-rate regulator device positioned on the chemical-liquid line such that the flow-rate regulator device is on an upstream side of the mixing device and configured to control a flow rate of the chemical liquid flowing through the chemical-liquid line, a first drain line which is branching from the diluted chemical-liquid line and drains the diluted chemical liquid flowing through the diluted chemical-liquid line, a first switching device positioned on a downstream side of the mixing device such that the first switching device is configured to switch a flow of the diluted chemical liquid such that the diluted chemical liquid is drained from the diluted chemical-liquid line through the first drain line, a bypass line which is branching from the chemical-liquid line on an upstream side of the flow-rate regulator device and merging to the chemical-liquid line on a downstream side of the flow-rate regulator device, a second switching device positioned on the bypass line such that the second switching device is configured to control a flow rate of the chemical liquid flowing through the bypass line, and a switching valve positioned on the chemical-liquid line such that the switching valve is on an upstream side of the mixing device and a downstream side of a merging point where the bypass line is merging to the chemical-liquid line and lowers pressure of the chemical liquid flowing in the chemical-liquid line to draw the liquid diluent or the diluted chemical liquid into the chemical-liquid line, the flow-rate regulator device comprises a first flow-rate regulator component positioned on an upstream side of the chemical-liquid line, and a second flow-rate regulator component positioned on a downstream side of the chemical-liquid line and connected in series to the first flow-rate regulator component, the first flow-rate regulator component is configured to adjust a degree of opening such that after the second flow-rate regulator component is set to a full opening, the first flow-rate regulator component sets a flow rate of the chemical liquid at the first flow-rate regulator component to a specified number of times greater than a target flow rate, and the second flow-rate regulator component is configured to adjust a degree of opening such that after the first flow-rate regulator component is set to the flow rate, the second flow-rate regulator component sets the target flow rate of the chemical liquid at the second flow-rate regulator component.

11. A liquid processing apparatus according to claim 10, wherein the diluted chemical liquid-supply apparatus comprises a concentration measuring device configured to measure a concentration of the diluted chemical liquid, and the second flow-rate regulator component of the flow-rate regulator device is configured to fine-adjust the degree of opening based on the concentration measured by the concentration measuring device.

12. A liquid processing apparatus according to claim 10, wherein the first flow-rate regulator component comprises a needle valve, and the second flow-rate regulator component comprises a needle valve.

13. A liquid processing apparatus according to claim 10, wherein the diluted chemical liquid-supply apparatus comprises a bubble separating device configured to separate the chemical liquid containing bubble from the chemical liquid flowing through the chemical-liquid line and positioned on the chemical-liquid line such that the bubble separating device is on a downstream side of the switching valve and the upstream side of the mixing device, and a second drain line which drains the chemical liquid containing bubble separated by the bubble separating device.

14. A liquid processing apparatus according to claim 10, wherein the mixing device comprises a static mixer positioned on an upstream side and a time-lapsing mixer on a downstream side.

15. A liquid processing apparatus according to claim 10, wherein the diluted chemical liquid-supply apparatus comprises a constant-pressure valve positioned on the chemical-liquid line such that the constant-pressure valve is on an upstream side of the flow-rate regulator device.

16. A liquid processing apparatus according to claim 10, wherein the diluted chemical liquid-supply apparatus comprises a tank configured to store the diluted chemical liquid prepared by the mixing device, a circulation line which circulates the diluted chemical liquid stored in the tank, and a branch line connected to the circulation line such that the branch line supplies the diluted chemical liquid flowing through the circulation line to the processing device.

17. A liquid processing apparatus according to claim 16, further comprising:

a control device comprising circuitry configured to control the diluted chemical liquid-supply apparatus,
wherein the diluted chemical liquid-supply apparatus comprises a concentration measuring device configured to measure a concentration of the diluted chemical liquid, and the circuitry of the control device is configured to control the first flow-rate regulator component to adjust the degree of opening such that the chemical liquid flows in the chemical-liquid line at the flow rate set to the specified number of times greater than the target flow rate when the second flow-rate regulator component has the full opening, control the second flow-rate regulator component to adjust the degree of opening such that the chemical liquid flows in the chemical-liquid line at the target flow rate when the first flow-rate regulator component is adjusted to have the degree of opening, control the diluted chemical liquid-supply apparatus to deliver the chemical liquid and the liquid diluent from the chemical-liquid line and the liquid-diluent line to the mixing device when the second flow-rate regulator component is adjusted to have the degree of opening such that the diluted chemical liquid is prepared, control the concentration measuring device to measure the concentration of the diluted chemical liquid, and control the diluted chemical liquid-supply apparatus based on the concentration of the diluted chemical liquid measured by the concentration measuring device such that when the concentration of the diluted chemical liquid is within an acceptable range, the diluted chemical liquid is delivered to the processing device and that when the concentration of the diluted chemical liquid is outside the acceptable range, the second flow-rate regulator component fine-adjusts the degree of opening to bring the concentration of the diluted chemical liquid within the acceptable range.

18. A liquid processing apparatus according to claim 17, wherein the circuitry of the control device is configured to control the switching valve to open such that the diluted chemical liquid is drained from the diluted chemical-liquid line through the first drain line without supplying the diluted chemical liquid prepared by the mixing device to the tank until a predetermined duration from a start of preparation of the diluted chemical liquid is passed, and open the bypass line such that the chemical liquid flows through the bypass line in an amount greater than an amount which the chemical liquid passes through the flow-rate regulator device.

19. A liquid processing apparatus according to claim 18, wherein the diluted chemical liquid-supply apparatus comprises a bubble separating device configured to separate the chemical liquid containing bubble from the chemical liquid flowing through the chemical-liquid line and positioned on the chemical-liquid line such that the bubble separating device is on a downstream side of the switching valve and the upstream side of the mixing device, and a second drain line which drains the chemical liquid containing bubble separated by the bubble separating device, and the circuitry of the control device is configured to control the bubble separating device such that the chemical liquid containing bubble flowing through the chemical liquid line is drained to the second drain line through the bubble separating device for at least a portion of the predetermined duration.

20. A liquid processing apparatus according to claim 10, further comprising:
a control device comprising circuitry configured to control the diluted chemical liquid-supply apparatus, wherein the circuitry of the control device is configured to control the first flow-rate regulator component to adjust the degree of opening such that the chemical liquid flows in the chemical-liquid line at the flow rate set to the specified number of times greater than the target flow rate when the second flow-rate regulator component has the full opening, control the second flow-rate regulator component to adjust the degree of opening such that the chemical liquid flows in the chemical-liquid line at the target flow rate when the first flow-rate regulator component is adjusted to have the degree of opening, and control the diluted chemical liquid-supply apparatus to deliver the chemical liquid and the liquid diluent from the chemical-liquid line and the liquid-diluent line to the mixing device when the second flow-rate regulator component is adjusted to have the degree of opening such that the diluted chemical liquid is prepared.

21. A liquid processing apparatus according to claim 10, further comprising:
a control device comprising circuitry configured to control the diluted chemical liquid-supply apparatus,
wherein the circuitry of the control device is configured to control the first flow-rate regulator component to adjust the degree of opening such that the chemical liquid flows in the chemical-liquid line at the flow rate set to the specified number of times greater than the target flow rate when the second flow-rate regulator component has the full opening, and control the second flow-rate regulator component to adjust the degree of opening such that the chemical liquid flows in the chemical-liquid line at the target flow rate when the first flow-rate regulator component is adjusted to have the degree of opening.

* * * * *